United States Patent [19]

Blough et al.

[11] Patent Number: 5,057,648
[45] Date of Patent: Oct. 15, 1991

[54] HIGH VOLTAGE HYBRID PACKAGE

[75] Inventors: David N. Blough, Linthicum; Ngon B. Nguyen, Jessup, both of Md.

[73] Assignee: Westinghouse Electric Corp., Pittsburgh, Pa.

[21] Appl. No.: 439,053

[22] Filed: Nov. 20, 1989

[51] Int. Cl.$^5$ .................. H01L 23/02; H05K 5/06
[52] U.S. Cl. .................. 174/52.4; 174/52.2; 357/74
[58] Field of Search .................. 174/52.1, 52.2, 52.3, 174/52.4; 357/72, 74, 75, 80, 70

[56] References Cited

U.S. PATENT DOCUMENTS

| | | | |
|---|---|---|---|
| 4,517,584 | 5/1985 | Matsushita et al. | 357/80 |
| 4,675,472 | 6/1987 | Krumme et al. | 174/52.4 |
| 4,729,010 | 3/1988 | Tsuchiya et al. | 357/70 |
| 4,827,082 | 5/1989 | Horiuchi et al. | 174/52.4 |
| 4,902,854 | 2/1990 | Kaufman et al. | 174/52.4 |

Primary Examiner—Leo P. Picard
Assistant Examiner—Bot Lee Ledynh

[57] ABSTRACT

A package for a heat generating, high voltage hybrid circuit is disclosed which comprises a package housing having a sidewall structure formed from an electrically insulative, thermally conductive ceramic material that obviates the need for using separate insulator structures between the sidewalls of the package and the electrical feedthroughs which afford electrical access to the circuit contained within the package housing. The feedthroughs include a layer of hardenable material for sealingly mounting a terminal connector through the sidewalls of the package. In one embodiment of the invention, the hardenable material sealingly mounts the terminal connectors of the electrical feedthroughs within circular openings in the sidewall structure. In another embodiment, the terminal connectors of the electrical feedthroughs include flat sections formed from copper directly deposited in recesses located within a ceramic frame disposed between the sidewall structure and the base of the package, and the hardenable material sealingly mounts the lower edge of the wall section over the upper surface of the ceramic frame. Both embodiments provide increased voltage and current carrying capacity in a package structure which is more reliable in operation.

22 Claims, 4 Drawing Sheets

HIGH VOLTAGE HYBRID PACKAGE

BACKGROUND OF THE INVENTION

This invention generally relates to packages for power circuits, and is specifically concerned with a package for a high voltage hybrid circuit having walls formed from an electrically insulative, heat conductive ceramic material, and improved electrical feedthrough structures.

Packages for hermetically sealing power hybrid circuits are known in the prior art. Such packages are typically used in airborne radar systems to protect delicate, heat generating power circuits from thermal overload and mechanical shock. Such packages include a housing formed from a heat conductive metal such as copper or a copper alloy that has been gold plated. The gold-plated base of the housing receives one or more ceramic substrates. Each substrate includes a network of conductive members on its top member, and an array of discrete electronic components and integrated circuits that are soldered onto to various junctions of the conductor network to complete the circuit. The bottom of the substrate is in turn mechanically and thermally connected to the base of the housing by indium-lead solders. A plurality of terminal connectors in the form of terminal posts provide access to the power circuit disposed on the substrates. These posts pass through the walls of the metallic housing, and terminate in thin lead wires which are in turn soldered onto various junctions within the circuit. To prevent the terminal posts from contacting the metallic housing and short-circuiting, each post is mounted in a housing wall by way of a glass post seal. To hermetically seal the circuit from the ambient atmosphere, the housing is filled with an inert gas such as nitrogen, and a metallic cover (which again may be copper or a copper alloy) is sealingly brazed or soldered around the upper edge of the housing.

While such prior art hermetic packages are generally capable of protecting delicate, miniaturized hybrid power circuits from mechanical shock and thermal overload, the applicant has noted a number of areas where the performance of these packages could be improved. For example, the applicant has noted that the glass post seals that insulatively mount the terminal posts through the walls of the housing are difficult to manufacture, and are one of the areas of the package most apt to mechanical failure. Such failure can break the hermetic seal of the package, and may even cause short-circuiting to occur between the various terminal posts and the circuit. The applicant has further observed that, because the maximum diameter of the glass post seals is limited by the height of the walls of the housing, such prior art packages are incapable of handling electrical potential beyond about 2 kilovolts before arcing will occur between the terminal posts and the metal forming the housing walls. Finally, the applicant has noted that the small diameter of the terminal posts used in such prior-art hybrid circuit packages, coupled with the thin lead wires, small bonding areas between these posts and the circuit substrates, and the small spacing between adjacent posts, imposed further limits not only on the maximum voltages that can be conducted through the posts, but on the maximum amperages as well.

Clearly, a hermetic package for a miniaturized hybrid power circuit is needed which offers improved performance over the prior art packages in the areas of maximum voltage and amperage capabilities, and mechanical and electrical reliability. Ideally, such a package would be able to handle large heat loads and thermally induced stresses without mechanical failure, and would be smaller in size, lighter in weight and easier to manufacture than known prior art packages and would not rely upon glass seals to insulatively mount terminals to the walls of the package housing. Finally, it would be desirable if the package could successfully handle large electrical currents without overheating and large voltages without the occurrence of electrical arcing between the terminal posts.

SUMMARY OF THE INVENTION

Generally speaking, the invention is a package for a heat generating, high voltage and amperage electrical circuit that comprises a housing having a sidewall structure that is substantially formed from an electrically insulative and thermally conductive ceramic material that obviates the need for the use of a separate insulator around the electrical feedthrough means that extend through the sidewalls of the structure. The bottom of the housing includes a base that may be formed from either a heat conductive metal or ceramic material. The top of the housing is covered by a metallic or ceramic lid that is welded around the upper edge of the sidewall structure. In the preferred embodiment, the ceramic material forming the wall structure and base is selected from the group consisting of beryllium oxide, aluminum nitride, silicon carbide, and alumina. In one embodiment of the invention, a heat conductive ceramic frame is disposed between the sidewall structure and the base.

The feedthrough means further includes a layer of hardenable material disposed over a terminal connector for securing and hermetically sealing the terminal connector in the housing. In one embodiment of the invention, the feedthrough means includes an opening in one of the sidewalls of the sidewall structure, and the terminal connector is in the form of a terminal post. In this embodiment, the layer of hardenable material serves to sealingly mount the terminal post within the opening in the sidewall. In another embodiment of the invention, the terminal connector includes a barrel-type terminal that is integrally connected to a flat section formed from copper or other conductive metal that has been direct-bonded over a recess located on the outer edge of the ceramic frame bonded to the package base. Preferably, the direct-bonded copper or other metal completely fills the recess so that the resulting flat section of the terminal connector is co-planar with the top surface of the ceramic frame. The layer of hardenable material not only serves to sealingly connect the lower edge of the sidewall structure over the flat section of the terminal connector; it also bonds the sidewall structure to the upper surface of the frame. In both embodiments, the hardenable material is preferably fireable glass, but may be an epoxy bonding agent. In the latter embodiment, the flat section of the terminal connector and its intimate bond with the heat-conductive ceramic forming the frame of the package advantageously increases the amount of current that the connector can handle by efficiently dissipating heat generated by the electrical resistance of the terminal connector. The use of such a flat section in the connector also allows the use of ribbon connectors in lieu of thin lead wires, which further enhances the current carrying capacity of the package.

To minimize thermal stresses in the wall structure, the material forming the terminal connector is selected so that its coefficient of thermal expansion is substantially the same as the coefficient of terminal expansion of the ceramic material forming the sidewalls. This material may be either an alloy of nickel, cobalt and iron such as Kovar ®, or Kovar ® that has a thin plating of pure copper around it that has been direct-bonded to the ceramic frame. To minimize the number of solder joints between the package housing and the circuit which it contains, the base may be ceramic, and the upper portion of the base may be used as the substrate of the circuit so that the heat generated by the circuit is conducted directly out of the package to the bottom surface of the base. Alternatively, the base may be formed from copper or Kovar ®, which simplifies manufacturing and further increases the over-all heat load capacity of the package. The lid that is sealingly mounted around the upper edges of the sidewall structure may be formed from a metal or ceramic having the same thermal coefficient of expansion as the ceramic material that forms the sidewall structure in order to minimize thermal stresses at the interface between the lid and the sidewalls. The lid is preferably welded onto a metal film that has been deposited around the upper edge of the wall structure. The hybrid package of the invention overcomes the limitations associated with prior art hybrid packages with a structure which is relatively easy and inexpensive to manufacture.

BRIEF DESCRIPTION OF THE SEVERAL FIGURES

FIG. 7A and 7B are enlarged, plan views of the feed-through structure used in the second embodiment of the invention, illustrating both the terminal connector and the recess within the ceramic frame that the connector is bonded to.

DETAILED DESCRIPTION OF THE PREFERRED EMBODIMENT

Figure 1A:
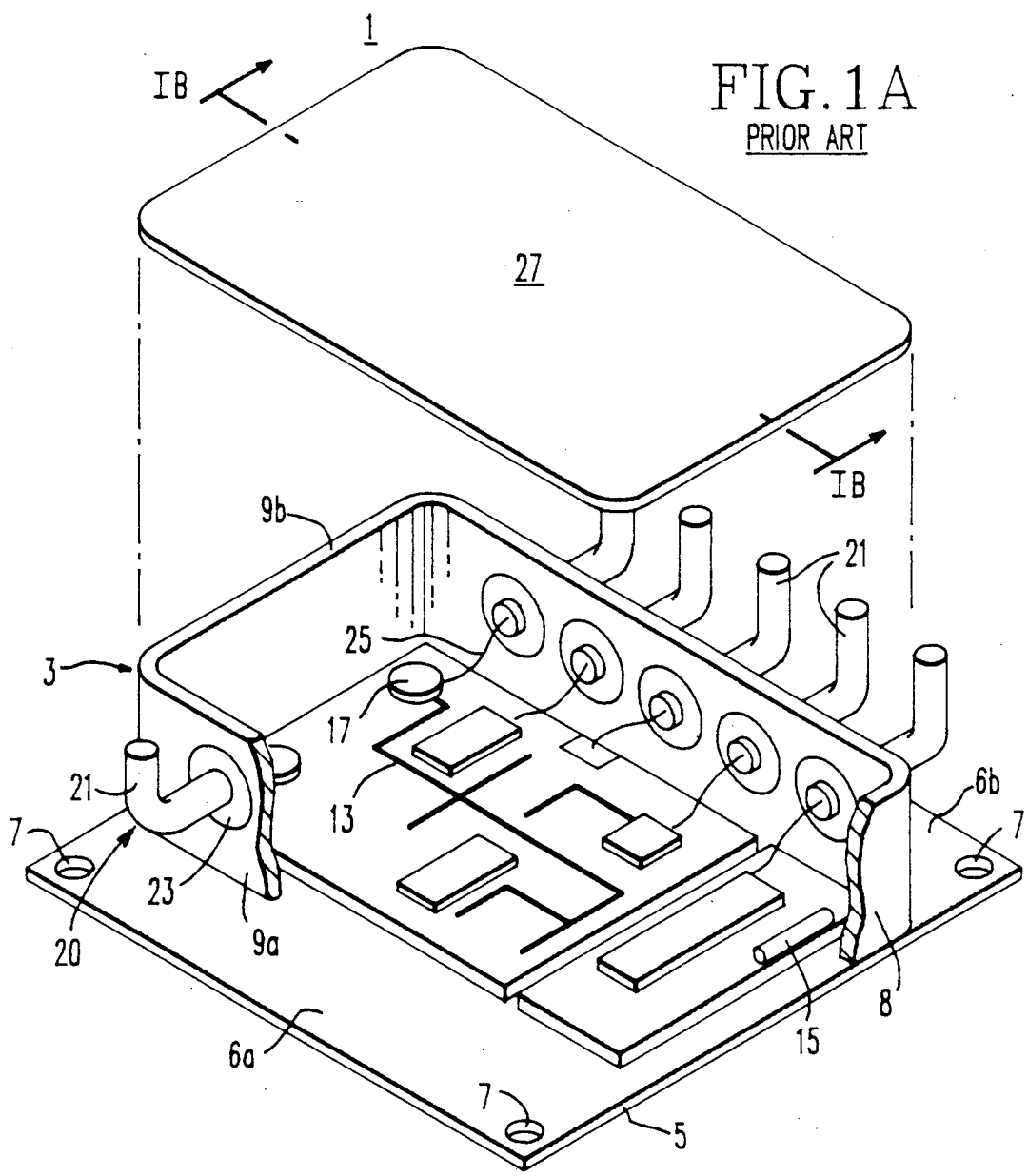
FIG. 1A is an exploded, perspective view of a prior art package for a power hybrid circuit.
Figure 1B:
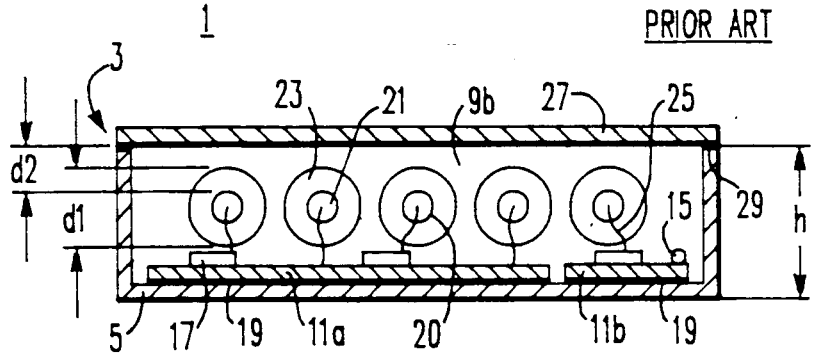
FIG. 1B is a cross-sectional side view of the package illustrated in FIG. 1A along the line 1B—1B.

The purpose of the invention is to provide a package for a hybrid power circuit that is superior in mechanical, thermal and electrical performance over the prior art package 1 illustrated in FIGS. 1A and 1B. This prior art package 1 includes a housing 3 formed from gold plated copper or a copper alloy. The bottom of the housing 3 includes a plate-like metal base 5 having opposing mounting flanges 6a,b. Holes 7 are disposed in the mounting flanges for attaching the package 1 to a heat-dissipating chassis. The housing 3 further includes a wall structure 8 having opposing sidewalls 9a,b which are integrally formed with a flat plate-like base 5. One or more ceramic substrates 11a,b are mounted in the interior of the wall structure 8. Each of the substrates 11a,b may include a pattern 13 of conductors formed by known techniques of substrate metalization. Both discrete components 15 and integrated circuit components 17 are mounted onto the substrates 11a,b at various junctions within the conductor pattern 13 of each to form a hybrid circuit.

Each of the ceramic substrates 11 is mechanically mounted onto the top surface of the base 5 by solder junctions 19 formed from a lead-indium alloy. Additionally, terminal connectors 20 in the form of posts 21 are mounted in each of the opposing sidewalls 9a,b by insulative glass post seals 23. The purpose of the terminal posts 21 is, of course, to provide electrical access to the hybrid circuit mounted onto the ceramic substrates 11a,b, and the inner ends of each of these posts 21 are connected to various junctions of the hybrid circuit by lead wires 25. To hermetically seal the hybrid circuit, a lid 27 is mounted around the upper edge of the wall structure by solder ring 29.

While such prior art packages 1 are capable of satisfactorily housing heat-generating circuits, the applicants have noted that one of the most common areas of failure in such packages is the interface between the terminal posts 21 and the opposing sidewalls 9. As previously pointed out, glass post seals 23 are used to insulate these posts 21 from the sidewalls 9a,b. However, the different thermal expansion characteristics of the glass forming the seals 23 and the metal forming the sidewalls 9 can cause the seals 23 to fail. Such failure can, in turn, cause the circuit to become exposed to the ambient atmosphere, and could possibly even result in breakage of one or more of the delicate lead wires 25 that interconnects the terminal posts 1 to the hybrid circuit.

In order to maximize the voltage capacity of such packages 1, the diameter d1 of the glass post seals 23 is made as large as possible, despite the fact that larger diameter post seals are more likely to crack than smaller diameter post seals. However, this diameter d1 is limited by the height h of the sidewalls 9a,b. The limitation imposed on the diameter d1 of the glass post seals 23 by the height h of the sidewalls 9a,b limits the maximum voltage that the package 1 can handle before arcing will occur between a posts 21, or between one post 21, and one of the metallic walls 9a,b, since the lower edge of the seals 23 must be positioned the lower edges of the sidewalls 9a,b. The resulting short distance between the posts 21 and the metallic walls 9a,b provides the shortest arcing path in such prior art packages 1.

The use of relatively narrow terminal posts 21, thin lead wires 25 and small area bonding points between the lead wires 25 and the substrates 11a,b results in still more limitations as to the over-all power capacity of such packages 1, as the concentrated shape of these conductors tends to concentrate arc-forming electric fields, and provides relatively poor heat dissipation when large currents are conducted through them.

Finally, the applicant has noted that the ceramic/solder/metallic base solder junctions 19 disadvantageously impairs the reliability of such packages 1. Because the thermal expansion characteristics of the ceramic structures 11a,b are typically different from the thermal characteristics of the metal forming the base 5, significant thermal-mechanical stresses can arise at the solder junctions 19. While the ductility of the solder forming the junctions 29 can normally accommodate such stresses, the applicant has noted that this solder can become embrittled over time by the formation of gold-indium intermetallic compounds. If this occurs, the resulting embrittlement of the junctions 19 coupled with the previously described mechanical-thermal stresses can cause the ceramic substrates 11a,b to become detached from the base 5. Such detachment could in turn apply unacceptably high stresses to the delicate lead wires 25, which may in turn short out the hybrid circuit contained therein.

Figure 2:
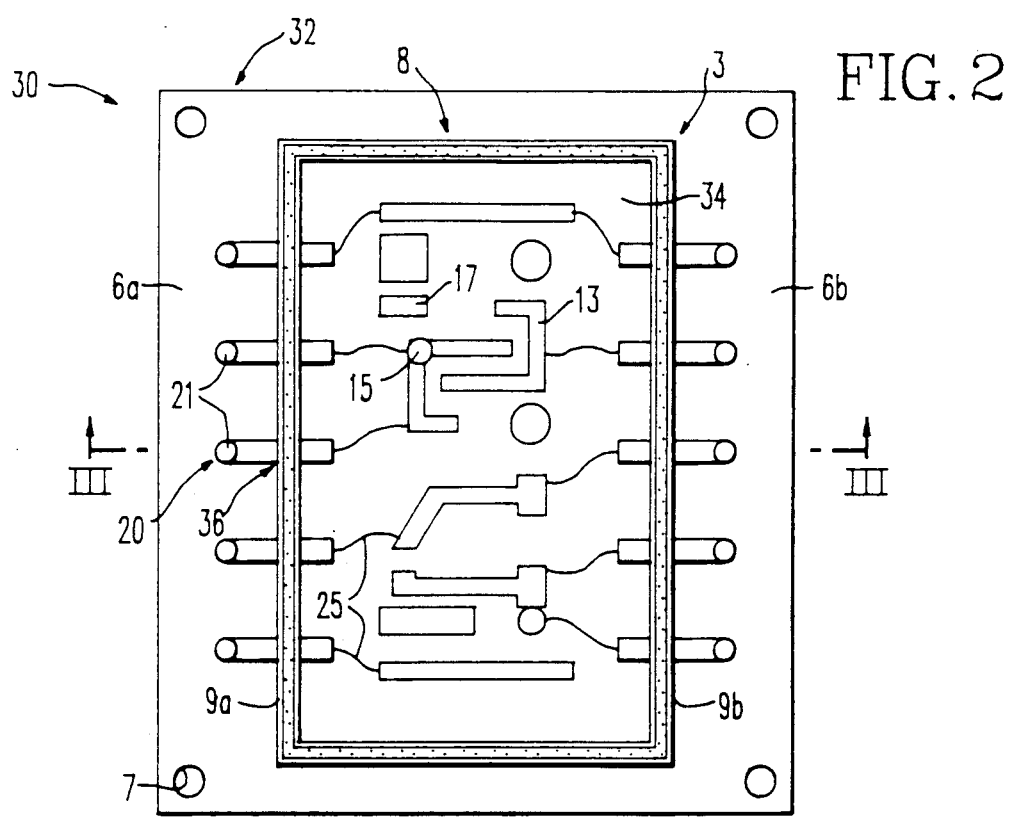
FIG. 2 is a plan view of one preferred embodiment of high voltage hybrid package of the invention with its lid removed so that the power circuit and electrical feedthroughs may be more clearly seen.
Figure 3:
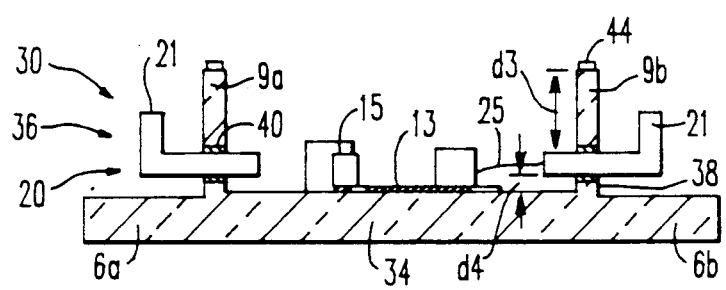
FIG. 3 is a cross-sectional side view of the package illustrated in FIG. 2 illustrating the manner in which the terminal, posts of the electrical feed-throughs are mounted in the wall assembly of the package housing.
Figure 4:
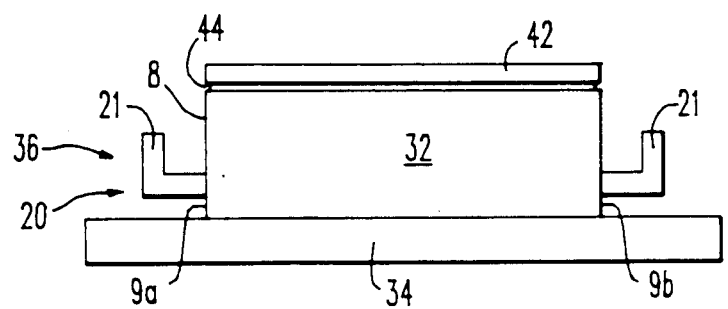
FIG. 4 is a side view of the package illustrated in FIG. 2 with its lid in place.
Figure 5:
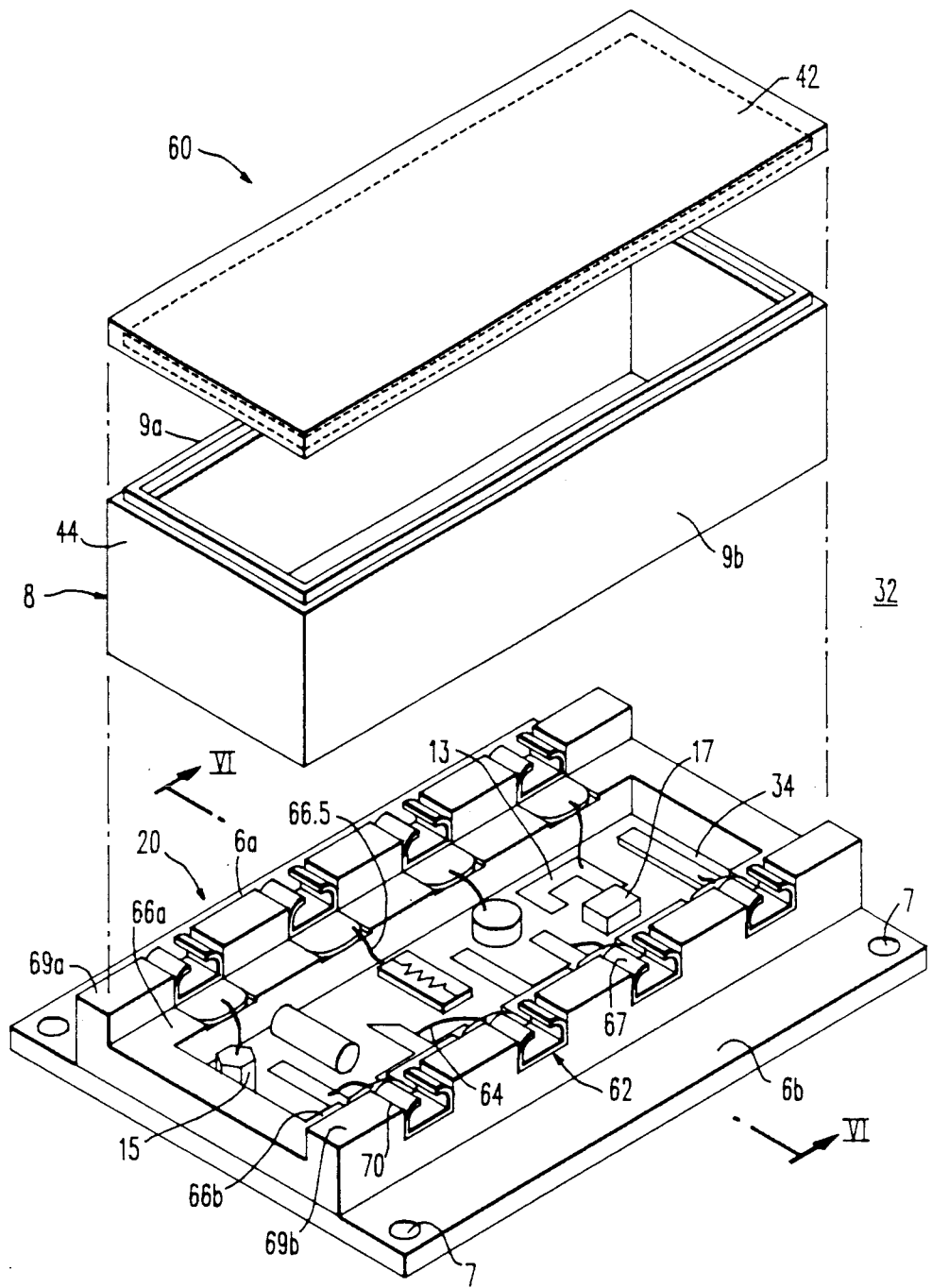
FIG. 5 is an exploded, perspective view of another embodiment of the high voltage hybrid package of the invention with its lid and sidewall structure removed so that the terminal connectors used in the electrical feed-throughs may be more clearly seen.

With reference now to FIGS. 2, 3 and 4, the hybrid package 30 of the invention includes a ceramic housing 32 which includes a ceramic wall structure 8 having sidewalls 9a,b. The wall structure 8 is formed from an electrically insulating but heat conductive ceramic material, such as beryllium oxide, aluminum nitride, silicon carbide or alumina. The base 34 of the package 30 may either be formed from the same ceramic as the wall structure 8, or from a heat conductive metal such as Kovar ®. The sidewall structure 8 and base 34 may be integrally molded together as shown in FIG. 2, or may be discrete components as shown in FIG. 5, depending on whether the base 34 is ceramic or metal. The base 34, preferably includes mounting flanges 6a,b having mounting holes 7. When the base 34 is a ceramic, conductor pattern 13 is preferably deposited over its upper surface onto which both discrete components 15 and integrated circuit components 17 are electrically connected. When the base 34 is metallic, separate ceramic substrates 11a,b are soldered onto its upper surface. Electrical access is provided to the power circuit contained within the housing 32 by means of terminal connectors 20 having terminal posts 21, which are preferably formed from gold-plated copper. Lead wires 25 interconnect these terminal posts 21 with various junctions within the power circuit.

The terminal posts 21 are conducted through the opposing walls 9a,b of the ceramic housing 32 by means of feedthrough structures 36. Each of these feedthrough structures 36 comprises a bore which extends completely through its respective sidewall 9a,b, and a ring of sealing material 40 which mechanically connects and hermetically seals its respective terminal post 21 to the bore 38. The ring 40 of sealing material may be formed from either a hermetic epoxy compound or a metallic brazing compound. In the latter case, the brazing material used is preferably a gold-germanium brazing compound which may, for example, consist of 88% gold and 12% germanium. In fabricating the feedthrough structure 36, the ring 40 of brazing material is installed in the form of a washer-like structure having an inner bore that can slidably receive a terminal post 21, and an outer diameter which is receivable within by closely dimensioned to the inner diameter of bore 38. The washer is thoroughly cleaned in a solution of hydrofluoric acid prior to the brazing operation in order to remove all oxides that may interfere with the brazing bond. After such a washer of brazing compound has been situated between the bores 38 and terminal posts 21 associated with each feedthrough structure 36, the entire ceramic housing 32 is heated in a furnace to a temperature of approximately 240° C. Such heating fuses the washer of gold-germanium brazing material, and creates a ring 40 of sealing material between each of the posts 21 and each bore 38 of every feedthrough structure 36 in order to securely mechanically interconnect each of the terminal posts 21 to its respective sidewall 9a,b in a hermetically sealed fashion. When an epoxy compound is used in lieu of metallic brazing material to form the ring 40 of sealing material, the posts 21 are merely glued to the bore 38 associated with each feedthrough structure 36 in a conventional manner. Of the two types of materials which may be used to form the ring 40, the use of a brazing compound is preferred due to the better hermetic seal afforded.

One important advantage of this embodiment of the hybrid circuit package 30 of the invention is the fact that each of the terminal posts 21 is separated from the other by insulating sections of the ceramic sidewalls 9a,b, which helps to prevent arcing from occurring between two different terminal posts 21 as well as the generation of unwanted capacitance between adjacent posts 21. Another advantage is that the posts 21 need not be mounted in the middle region of the opposing sidewalls 9a,b, with respect to the vertical, which allows lengthening the arcing path between the inner end of each of these posts 21, and the metallic lid 42. This aspect of the invention may best be appreciated with respect to FIG. 3, which shows how the distance d3 between the posts 21 and the upper surface of the metallic lid 42 may be made considerably larger than the distance d4 between the posts 21 and the upper surface of the ceramic base 34. This is possible by virtue of the relatively small diameter of each of the feedthrough structures 36. Alternatively, if the lid 42 is formed from a non-conductive ceramic material, the relatively small diameter of the feedthrough structures 36 would allow the terminal posts 21 to be mounted relatively high up on the walls 9a,b. Such a configuration would minimize capacitance between the terminal posts 21, and the circuit contained within the housing. Since such capacitance poses a potential threat to the trouble-free and reliable operation of the circuit contained within the housing 32, the reduction of this capacitance would constitute another significant advantage of the invention. As readily apparent in FIG. 3, the use of a non-conductive epoxy material to form the sealing ring 40 of each of the feedthrough structures 36 maximizes the extent to which d3 can be made larger or smaller than d4.

The ceramic housing 32 is capped by means of a lid 42 which is preferably formed from a metal such as Kovar ® having substantially the same thermal coefficient of expansion as the ceramic forming the housing 32. However, lid 42 may also be formed from the same type of thermally conductive but electrically insulating ceramic material that forms the housing 32, such as beryllium oxide, aluminum nitride, silicon carbide or alumina. Like the terminal posts 21, the ceramic lid 42 is preferably mechanically secured and hermetically sealed over the upper edges of the wall structure 8 of the housing 32 by means of a sealing ring 44 which is preferably a metallic film that is weldable to the lid 42 but which may also be an epoxy material.

As has been previously indicated, the fact that the upper surface of the base 34 may be used as a ceramic substrate onto which a circuit may be constructed when the base 34 is formed from a ceramic material advantageously eliminates the use of separate ceramic substrates for this purpose, and even more importantly obviates the need for any braze joints between such ceramic substrates in the upper surface of the base which could break and render the entire package inoperative.

Figure 6:
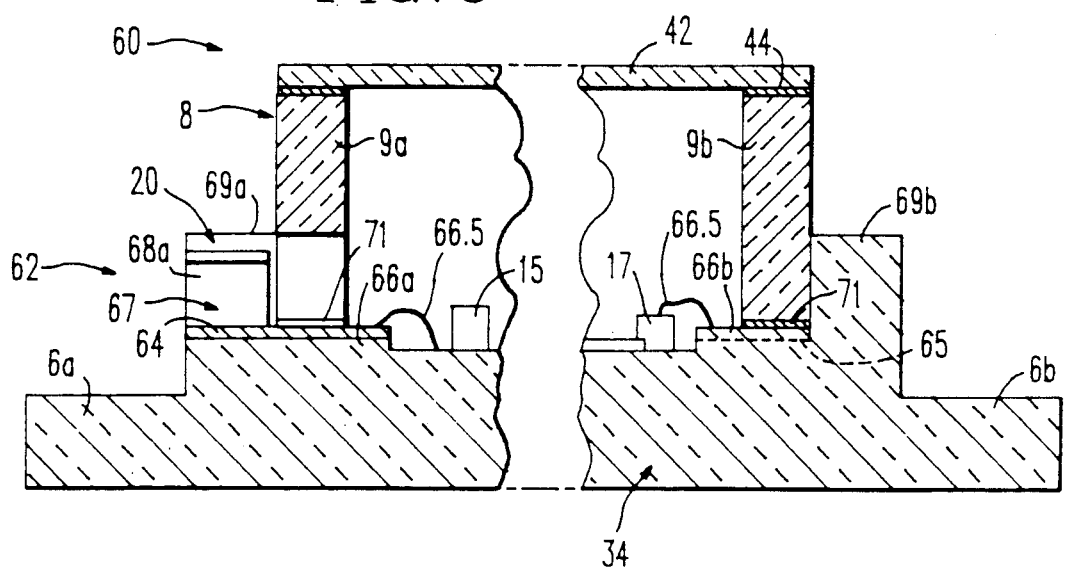
FIG. 6 is a cross-sectional side view of one of the terminal connectors used in the hybrid package illustrated in FIG. 5 along the line 5—5.

FIGS. 5 and 6 illustrate an alternative embodiment 60 of the hybrid power package of the invention that is particularly well adapted to handling large currents. In this embodiment, the wall structure 8 and the base 34 are not integrally formed together, but rather are in the form of two discrete components which, as will be seen hereinafter, are bonded together through a ceramic terminal frame 35 disposed between the upper surface of the base 34, and the lower edge of the wall structure 8. Like the previously described embodiment 30 of the invention, the wall structure 8 is preferably formed from an electrically insulating but thermally conductive ceramic material such as beryllium oxide, aluminum nitride, silicon carbide or alumina. The terminal frame 35 is also fabricated from these same ceramic materials. However, the base 34 of this embodiment is preferably formed of Kovar ® or some other highly heat conductive metal to maximize the heat dissipating ability of the package 60. The bottom of the ceramic terminal frame 35 is brazed or otherwise bonded to the upper surface of the base 34 as shown in FIG. 6. Additionally, both the terminal connector 20 and the feedthrough structure 62 used in this alternate embodiment differ significantly from the previously discussed embodiment 30. Specifically, the terminal connectors 20 include flat sections 64 as shown, and the feedthrough structures 62 which accommodate these connectors 20 include complimentary recesses 65 disposed in a pair of shallow, opposing steps 66a,b in the ceramic frame 35 for receiving the flat section 64 of the terminal connectors 20. Additionally, instead of the thin lead wires 25 used in the first embodiment 30, the alternative embodiment 60 utilizes ribbon connectors 66.5 which are soldered between the flat sections 64 of the terminal connectors 20, and the circuit mounted on the top surface of the ceramic base 34. The use of an extended, flat section 64 in lieu of a terminal pin 21 in combination with the use of ribbon-type connector 66.5 in lieu of relatively thin lead wires 25 enables the feedthrough structure 62 of the alternate embodiment 60 to handle much greater current densities than the first embodiment 30. The corners of the flat section 64 of each of the terminal connectors 20 are rounded to help prevent the concentration of an intense electric field that could encourage arcing.

At their outer ends, each of the terminal connectors 20 terminates in a barrel-type clip section 67 formed from a pair of opposing, resilient clips 68a,b. The use of such a barrel-type clip section 67 affords much greater contact area between the terminal connectors 20 than a terminal post 21, and provides an easy and quick means for connection and disconnection to the circuit within the package 60. As is best seen in FIG. 5, each of the clip sections 67 of the terminal connectors 20 of this embodiment are disposed in recesses 70 present in a pair of opposing buttresses 69a,b which are integrally formed with both the shallow steps 66a,b of the ceramic frame 35. The disposition of each of the clip sections 67 of the terminal connectors 20 within one of the rectangular recesses 70 in the buttresses 69a,b serves two important purposes. First, the sides of the recesses 70 mechanically reinforce the resilient clips 68a,b forming each of the clip sections 67, thereby preventing them from becoming spladed apart. Secondly, the sections of the buttresses 69a,b disposed between each of the clip sections 67 provide positive electrical insulators between each adjacent clip section 67, thereby discouraging electrical arcing. The two opposing buttresses 69a,b also provide a third function quite apart from the housing of the clip sections 67 in providing lateral support for the sidewalls 9a,b of the sidewall assembly 8, as is best seen in FIG. 6. The lower edges of the sidewall assembly 8 are sealingly connected over the top surface of the shallow steps 66 by means of a layer of nitrogen fireable glass 71.

Figure 7A:
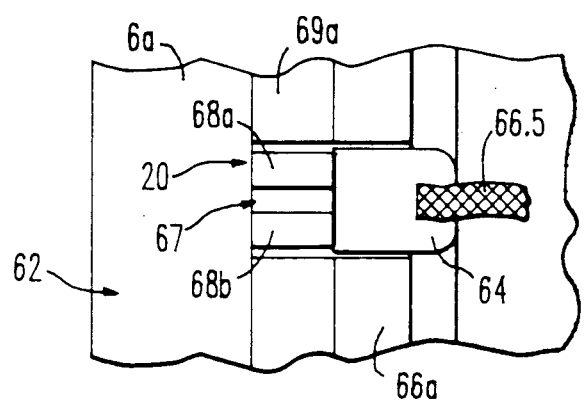
Figure 7B:
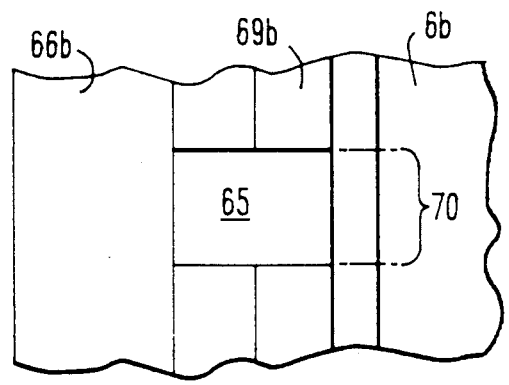

With reference now to FIGS. 6, 7A and 7B, each of the terminal connectors 20 of the second embodiment 60 is secured onto the ceramic base 34 by direct bonding techniques which are presently known in the art. Specifically, each of the terminal connectors 20 is first exposed to heat in an oxygen atmosphere in order to form a layer of copper oxide on all its surfaces. While a terminal connector 20 formed entirely of copper may be used for this purpose, a terminal connector 20 formed substantially from copper-plated Kovar ® is preferred, in view of the fact that the thermal expansion characteristics of Kovar ® more closely match the thermal expansion characteristics of ceramic. In the next step of the bonding process, the flat section 64 of each of the terminal connectors 20 is disposed within one of the complimentary recesses 65 on the shallow steps 66a,b on the ceramic base 34. Next, the ceramic base 34 and copper terminal connectors 20 are subjected to a temperature of approximately 1,100° C. Such high temperature causes the copper oxide to securely bind all surfaces of the terminal connector 20 in contact with the recess 65 with the ceramic material forming the base 34. In the next step of the assembly of the second embodiment 30, a layer of fireable glass 71 is disposed over the flat sections 64 of the terminal connectors 20 and the ceramic sections of the shallow steps 66a,b disposed between each of the connectors 20, and the lower edge of the wall assembly 8 is placed in the position illustrated in FIG. 6. The entire subassembly of the hybrid circuit 60 is then subjected to a temperature of between 400° C. and 800° C. This causes the layer of fusible glass 71 to fuse, and to permanently and hermetically bond the lower edge of the wall assembly 8 over both the flat section 64 of the terminal connectors 20, and the upper surface of the shallow steps 66a,b. Next, ceramic substrates 11a,b to which various circuit components 15 and 17 have been electrically connected are soldered to the top surface of the base 34, and the ribbon connectors 66.5 are soldered into the positions shown. Finally, a lid 42 (which may either be formed from a ceramic material or a metal such as Kovar ®) is welded into sealing engagement over the upper edges of the wall assembly 8 in the position illustrated in FIG. 6.

We claim:

1. A package for a heat generating electrical circuit system, comprising:
a package housing including a sidewall structure having at least one sidewall substantially formed from an electrically insulative material and a plurality of feed-through means for providing electrical access to said electrical circuit system, wherein an electrical potential is present between at least two adjacent feed-through means, said insulative material of said sidewall structure eliminating unwanted arcing between adjacent feed-through means,
wherein said feed-through means includes a terminal connector that is connected to said circuit system, wherein said feed-through means further includes a layer of hardenable material over said terminal connector for securing said terminal connector in said package housing and for hermetically sealing said package housing.

2. A package for a heat generating electrical circuit system defined in claim 1, wherein said package housing includes a base formed from the same insulative material as said sidewall.

3. A package for a heat generating electrical circuit system defined in claim 2, wherein said base is integrally formed with respect to said sidewall structure.

4. A package for a heat generating electrical circuit system defined in claim 2, wherein said base includes an upper portion that forms the substrate of the heat generating circuit.

5. A package for a heat generating electrical circuit system defined in claim 1, wherein said feedthrough means includes an opening in said sidewall for receiving said terminal connector, and said layer of hardenable material secures said terminal connector in said opening and hermetically seals said housing.

6. A package for a heat generating electrical circuit system, comprising:
   a package housing including a sidewall structure having at least one sidewall substantially formed from an electrically insulative material and a plurality of feed-through means for providing electrical access to said electrical circuit system, wherein an electrical potential is present between at least two adjacent feed-through means, said insulative material of said sidewall structure eliminating unwanted arcing between adjacent feed-through means,
   wherein said sidewall is formed from a heat conducting ceramic material,
   wherein said feed-through means includes a terminal connector that is connected to said circuit system,
   wherein the coefficient of thermal expansion of the material forming the terminal connector is substantially the same as the coefficient of thermal expansion of the ceramic material forming the sidewalls.

7. A package for a heat generating electrical circuit system defined in claim 5, wherein said ceramic material is selected from the group consisting of beryllium oxide, aluminum nitride, silicon carbide and alumina.

8. A package for a heat generating, high voltage hybrid circuit system, comprising:
   a package housing having a base substantially formed from a heat conductive material, a sidewall structure including sidewalls that are integrally interconnected and formed from an electrically insulative but heat conductive ceramic material, and a plurality of feed-through means for providing electrical access to said high voltage hybrid circuit system, wherein an electrical potential is present between at least two adjacent feed-through means, said insulative material of said sidewall structure eliminating unwanted arcing between adjacent feed-through means,
   wherein said feed-through means includes a terminal connector that is connected to said circuit and a layer of hardenable material for securing said terminal connector in said package housing to hermetically seal said package housing.

9. A package for a heat generating, high voltage hybrid circuit system as defined in claim 8, wherein said package housing includes a frame formed from an electrically insulative but thermally conductive ceramic material, said frame being connected to a bottom edge of said sidewall structure and a top surface of the base.

10. A package for a heat generating, high voltage hybrid circuit system as defined in claim 9, wherein said sidewall structure is connected to said frame by the same hardenable material that secures said terminal connector in said housing.

11. A package for a heat generating, high voltage hybrid circuit system as defined in claim 10, wherein said feed-through means includes an opening in one of said sidewalls for receiving said terminal connector, and said terminal connector includes a terminal post insertable through said opening, and said layer of hardenable material sealingly secures said terminal post into said opening.

12. A package for a heat generating, high voltage hybrid circuit system as defined in claim 11, wherein said feed-through means is closer to an upper edge than the bottom edge of said sidewall structure to reduce the capacitance between the terminal connectors of said feed-through means and the circuit contained in the package.

13. A package for a heat generating, high voltage hybrid circuit system as defined in claim 9, wherein said terminal connector is disposed between said base and said bottom edge of said sidewall structure, and said layer of hardenable material is a fireable glass that serves to sealingly mount said bottom edge of said sidewall structure to said frame.

14. A package for a heat generating, high voltage hybrid circuit system as defined in claim 13, further comprising a lid means for further enclosing said circuit system that is formed from the same ceramic material as said sidewall structure to minimize thermal stresses therebetween.

15. A package for a heat generating, high voltage hybrid circuit system as defined in claim 13, wherein said terminal connector includes a flat section for dissipating heat that is coplanar with the portion of said frame that is connected to the bottom edge of said sidewall structure.

16. A package for a heat generating, high voltage hybrid circuit system as defined in claim 15, wherein said flat section is formed from a conductive metal that is directly bonded to said base.

17. A package for a heat generating, high voltage hybrid circuit system as defined in claim 15, further comprising a ribbon connector between the flat section of the terminal connector and the circuit contained in the package for maximizing the current carrying capacity of the package.

18. A package for a heat generating, high voltage hybrid circuit system as defined in claim 8, wherein said ceramic material is selected from the group consisting of beryllium oxide, aluminum nitride, silicon carbide and alumina.

19. A package for a heat generating, high voltage hybrid circuit system as defined in claim 8, wherein the coefficient of thermal expansion of the material forming the terminal connector is substantially the same as the coefficient of thermal expansion of the ceramic material forming the sidewalls.

20. A package for a heat generating, high voltage hybrid circuit system as defined in claim 8, wherein said terminal connector is formed from a metal having about the same thermal coefficient of expansion as the ceramic material forming the sidewalls to minimize stresses in said sidewalls caused from thermal differential expansion.

21. A package for a heat generating, high voltage hybrid circuit system as defined in claim 20, wherein said terminal connector is formed from an alloy of nickel, cobalt and iron.

22. A package for heat generating, high voltage hybrid circuit, comprising:

a package housing having a base substantially formed from a heat conductive material and mountable onto a heat dissipating structure for supporting said hybrid circuit, a sidewall structure having a bottom edge and including sidewalls that are integrally interconnected and formed from an electrically insulative but heat conductive ceramic material and feed-through means for providing electrical access to said hybrid circuit including a plurality of terminal connectors that are connected to said circuit and a layer of hardenable material for securing said terminal connector in said housing and hermetically sealing said package housing, and a frame formed from the same insulative ceramic material as said sidewall structure that is sealingly connected to the bottom edge of said sidewall structure and to an upper surface of said base, wherein said terminal connectors include a flat section for dissipating heat that has been directly bonded to said frame, and said layer of hardenable material further serves to sealingly connect the bottom edge of said sidewall structure to said base and over said flat section of said terminal connector wherein an electrical potential is present between at least two adjacent terminal connectors, said insulative material of said sidewall structure eliminating unwanted arcing between adjacent terminal connectors.

* * * * *